United States Patent [19]

Bergmann et al.

[11] Patent Number: 4,916,026

[45] Date of Patent: * Apr. 10, 1990

[54] LAMINATE

[75] Inventors: Erich Bergmann, Mels, Switzerland; Harald Pfestorf, Untereisesheim; Jürgen Braus, Walldorf, both of Fed. Rep. of Germany

[73] Assignee: Balzers Aktiengesellschaft, Furstentum, Liechtenstein

[*] Notice: The portion of the term of this patent subsequent to Dec. 26, 2006 has been disclaimed.

[21] Appl. No.: 72,099

[22] Filed: Jul. 10, 1987

[30] Foreign Application Priority Data

Jul. 15, 1986 [CH] Switzerland .................. 02806/86

[51] Int. Cl.[4] .............................. B22F 7/04
[52] U.S. Cl. ...................... 428/555; 384/42; 384/624; 384/912; 428/552; 428/554; 428/557; 428/652; 428/653; 428/668; 428/674; 428/676; 428/681
[58] Field of Search ............... 428/554, 555, 557, 652, 428/653, 668, 674, 676, 687; 384/42, 624, 912

[56] References Cited

U.S. PATENT DOCUMENTS

| 2,799,080 | 7/1957 | Duckworth | 428/554 |
|---|---|---|---|
| 3,285,680 | 11/1966 | Dailey | 428/554 |
| 3,403,010 | 9/1968 | MacDonald et al. | 428/554 |
| 4,140,592 | 2/1979 | Orlando | 384/912 |
| 4,188,079 | 2/1980 | Mori | 384/294 |
| 4,277,113 | 7/1981 | Heshmat | 384/905 |
| 4,307,998 | 12/1981 | Nakayama et al. | 384/912 |
| 4,309,064 | 1/1982 | Fukuoka et al. | 384/912 |
| 4,404,263 | 9/1983 | Hodes et al. | 384/908 |
| 4,608,085 | 8/1986 | Eudier et al. | 384/912 |
| 4,645,360 | 2/1987 | Eastwood et al. | 384/912 |

FOREIGN PATENT DOCUMENTS

| 2853724 | 7/1981 | Fed. Rep. of Germany . |
|---|---|---|
| 2914618 | 9/1983 | Fed. Rep. of Germany . |
| 3404880 | 8/1986 | Fed. Rep. of Germany . |
| 58-94631 | 6/1983 | Japan .................. 384/42 |

Primary Examiner—Stephen J. Lechert, Jr.
Attorney, Agent, or Firm—McGlew & Tuttle

[57] ABSTRACT

Sliding layers overlays produced by cathode sputtering comprise a matrix-forming metallic material and at least one other material which is substantially insoluble in the matrix have greatly improved mechanical and corrosion resistance properties, if the insoluble material has a lower melting point than the matrix material, and if the diameters of the particles of the insoluble material are statistically normally distributed with mean $\bar{x}<0.8$ μm. Such overlays are produced with the temperature of the substrate maintained below 150° C. during the sputtering process. Coating rates of $>0.2$ μm [of layer thickness] per minute may be used informing such overlays.

19 Claims, 2 Drawing Sheets (a)

(b)

LAMINATE

BACKGROUND OF THE INVENTION

Field of the Invention

This invention relates in general to cathode sputtering techniques in particular to a new and useful sliding layer produced by cathode sputtering.

The invention relates to a laminate material having at least one layer for sliding a "sliding layer", hereinafter referred to as an "overlay", which overlay is applied by cathode sputtering, wherewith said overlay is comprised of a mixture of particles sputtered-on in a statistical distribution [i.e., of the particle diameters], each of which particles is comprised of a metallic material which forms a solidly coherent matrix and at least one other metallic material which other metallic material when in the solid state is practically insoluble in or undetachable from the material of said matrix. The invention further relates to a method of manufacturing the inventive laminate, and to a practical application of same i.e., use of the laminate.

Sliding layers as surface layers of laminate materials are used, e.g., for bearing seats of internal combustion engines. Such layers must have the following properties, among others: lower hardness than the material of the shaft, high resistance to dynamic stresses of an alternating nature, high shear strength, thermal stability of mechanical properties, and high corrosion resistance. These requirements are met by mixtures of lead or tin with other metals which lend mechanical strength by forming a coherent matrix, and which other metals are themselves corrosion resistant and do not dissolve tin or lead (e.g., Al, Cr, or Ni). Laminates with lead-containing or tin-containing overlays, and methods of manufacturing same by cathode sputtering, are described in Ger. Pats. 2,853,724 and 2,914,618, and in Ger. OS 34 04 880. When these methods have been used, substantial problems have arisen with regard to achieving high adhesive strength and bonding strength between the substrate and the applied overlay. Furthermore, these methods lead to a relatively coarse structure of the overlay, with randomly distributed inclusion particles of Sn or Pb of several micron diameter. Such a structure of the overlay leads to corresponding degradation of the corrosion resistance properties.

In addition, according to the state of the art it is considered important for an overlay applied by sputtering and based on an alloy composition AlSn20 in a conventional steel/Cu/Pb three-layer laminate arrangement to have at least a finer distribution of the Sn-containing particles than the rolled layers produced by ordinary methods. Nonetheless, even such overlays lead to poorly defined, heterogeneous mixtures of Al and Sn. Precise data on mean particle size in such overlays, and on reproducible reaction conditions (i.e., reaction conditions for producing reproducible product quality) for manufacturing such overlays have not been made public thus far (see Engle, U., 1986, "Development and testing of new multilayer materials for modern engine bearings: Part 2—copper-lead three-layer bearings with sputtered overlay", in SAE Tech.Pap. Ser., Int. Cong. and Expo., Detroit, Feb. 24–28, pp. 76–77).

According to the state of the art it has been proposed to harden the matrix by appropriate incorporation of oxides ("dispersion hardening"). In practice this has also led to major problems. Thus, for a matrix comprised of Al, oxide particles in amounts of 0.1–0.5 wt.% have been prescribed (Ger. Pat. 2,914,618 Col. 5). Such concentrations are very difficult or impossible to control in manufacturing of, e.g., sliding bearings, on a large serial production scale. The result again is sharp variations in properties of the overlay and unsatisfactory reproducibility of the method of producing the overlays.

SUMMARY OF THE INVENTION

Accordingly, the underlying problem of the invention is to improve a laminate of the type described initially supra, such that its adhesion and corrosion resistance are substantially improved, and the method of producing it is reproducible.

This problem is solved according to the invention as follows:

(a) The material substantially locked in the matrix has a lower melting point than the matrix material; and (b) The diameters of the particles of the material substantially locked in the matrix are statistically normally distributed, with mean value $\bar{x} < 0.8$ μm.

The problem cannot be solved by merely employing a standard overlay produced by cathode sputtering. The inventive overlay employs specific techniques to produce specific properties. It has been discovered in connection with the invention that, surprisingly, the mechanical properties required for sliding bearings are conferred by a distribution of the particles containing the insoluble material which distribution (i.e., the mean particle size of which distribution) is finer by about tenfold than that made public according to the state of the art, and with no participation of (i.e., no measures carried out to provide) oxide particles. For example, continuous-cast AlSn20Cu has Vickers hardness 35, which can be increased to 130 by dispersion hardening with oxide particles (Ger. Pat. 2,853,724, Col. 6), whereas the inventive overlays attain a Vickers hardness ($HV_{0.1}$) of at least 160 without participation of oxides. This 180 hardness can be increased to c, 200 by appropriate addition of 0.2 wt.% (maximum) of oxides. Further, the inventive overlays have substantially improved annealing stability compared to the overlays made public in the state of the art. Heat treatment of conventional overlays at 170° C. for 300 hr leads to a substantial decrease in hardness (see Ger. Pat. 2,853,724), whereas with inventive overlays subjected to the same treatment the hardness does not decrease below 170.

The inventive overlays also have much higher corrosion resistance than layers hardened by oxide dispersion. This is attributable to smaller pore size between the matrix and the insoluble particles (in the inventive overlays). Further, the fine and uniform distribution of the particles fixed in the matrix enables one to employ virtually any proportion of the fixed material in the overlay without a risk that the particles will be torn out of the matrix material by some mechanical stress (in particular, alternating dynamic stresses), or that cracks will develop due to internal stress concentration in the overlay. These considerations underlay the improved resistance of the inventive overlays to alternating dynamic stresses in comparison to the resistance of conventional overlays; and the improved thermal stability of the mechanical properties of the inventive overlays.

In a refinement of the invention, at least one of the relatively low melting elements Sn (m.p. 231.89° C.), Pb (m.p. 327.4° C.), or In (m.p. 156.4° C.) may be used in particular as the material substantially undetachable from the matrix. For specific applications, other low melting metals and their alloys are good candidates—[e.g.,] Cd (m.p. 320.9° C.), Bi (m.p. 271.3° C.), Tl (m.p. 302° C.), Zn (m.p. 419.5° C.), and Ga (m.p. 29.8° C.). The invention is particularly advantageous for laminate materials or laminate workpieces in which the matrix-forming material contains a customary sliding-bearing alloy the main component of which is at least one of the following elements: Al, Cr, Ni Mg, or Cu. In practice, it has proved particularly advantageous if the overlay has an overall composition comprising one of the following combinations: AlCuSn, AlCuPb, AlCuSnPb, AlSiSn, AlSiPb, AlSiSnPb, CuSn, CuPb, or CuSnPb. The inventive overlays preferably have layer thicknesses between 10 and 30 micron, the lower half of this range (12–16 $\mu$m) being sufficient for most application situations. Accordingly, it is not necessary to employ the optimal layer thickness of 18 $\mu$m recommended according to the state of the art for conventional two-component overlays (see Engel, loc.cit., p. 76).

According to another refinement of the invention, the diameters of the particles of the material, substantially locked in the matrix have a normal distribution, preferably with mean value $x=0.05-0.4$ $\mu$m. Experiments have shown that the inventive effects can be achieved with $\bar{x}$ up to $<0.8$ $\mu$m [sic—i.e., x up to slightly less than 0.8 $\mu$m].

It is known from the state of the art (Ger. Pat. No. 2,914,618, Col. 5; Ger. Pat. 2,853,724, Col. 5) that oxide contents between 0.1 and 0.5 vol. % [sic] lead to so-called dispersion hardening. It has been found, surprisingly, that the inventive overlays produced by appropriate techniques ([e.g.,] target maintained in an inert gas atmosphere) whereby their oxygen content is reduced (i.e., in comparison to customary overlays) to <0.2 wt. % have much better mechanical properties than dispersion-hardened overlays according to the state of the art. Thus, hardening by reducing the diameters of the implanted particles can be advantageously substituted for hardening accomplished by providing dispersed oxide particles. The inventive overlays are particularly suitable as surface layers of three-layer sliding bearings, wherein a support layer comprised of a material with good "emergency running properties" is disposed between the base material (bearing backing) and the overlay. There are various possibilities for the composition of this "underlay" material; the important criterion is that they be less hard than the overlay. In particular, these "underlays" may contain elements as Sn, Pb, Sb, and Cu, or known alloys such as tin bronzes, tin-lead bronzes (see DINs 1705, 1716, 1718, and 17 662) or babbitt metals (see Neale, M. J. (Ed.), 1975, "Tribology Handbook", pub. in London, Table C-1). The Brinell hardness of these supporting underlays should be between 30 and 100 kp/sc $\mu$m.

It has also proven advantageous to provide a thin blocking layer which is applied between the overlay and the base material. Like the overlay, this layer is also applied by cathode sputtering. Its function is to prevent diffusion of material from the overlay into the base material or/and the supporting underlay. This diffusion-blocking layer advantageously has a thickness of c. 2 $\mu$m, and may employ as its main component any of the matrix-forming materials of the overlay. Compositions comprising Cr and Ni together have proven particularly suitable. The diffusion-blocking layer is advantageously applied between the overlay and the support layer disposed below the overlay. However, for special applications it is possible to apply the blocking layer between the said support layer and the base material (bearing backing). Also, a plurality of superposed sliding layers (overlays) may be employed, for special applications.

The invention further relates to a method of manufacturing the proposed laminate materials, wherein the overlay is applied by sputtering.

The underlying problem of the method part of the invention is to devise manufacturing techniques which are reproducible (in contrast to the techniques publicized in the state of the art) and thereby are capable of producing products which have constant [i.e. uniformly controllable] mechanical and corrosion-resistance properties.

This problem is solved according to the method aspect of the invention in that the temperature of the substrate to be coated is kept below 150° C. during the coating. It has been discovered (in connection with the invention) that, surprisingly, such a reduction of the substrate temperature during sputtering leads to an unexpectedly large reduction of the mean diameter of the particles insoluble in the matrix, from several microns to a value between 0.05 and 0.8 $\mu$m, and thereby leads to the inventive properties of the applied overlay (e.g. higher strength under alternating [dynamic stresses], and higher corrosion resistance). Another factor, beside reduction of the coating temperature, which other factor also contributes to the inventive fine particle size distribution of the insoluble component is increased coating speed (in comparison to the state of the art), namely $>0.2$ $\mu$m [of thickness] per minute. This discovery can be applied advantageously in situations in which insufficient amounts of cooling water are available for carrying out the method.

According to a refinement of this method, the various materials of the overlay, i.e. the matrix-forming material and the material insoluble in the matrix, are applied simultaneously to the substrate by sputtering, whereby the inventive fine particle size distribution is further improved. In an advantageous technique for this, more than half of the targets employed in the method contain both the main component of the matrix and the material insoluble or locked in the matrix. Depending on the composition of the desired overlay, alloys of the following types may be employed: AlCuSn, AlCuPb, AlSiSn, AlSiPb, AlSiSnPb, CuSn, CuPb, [or] CuSnPb. In order to keep the oxygen (or oxide) content of the overlay under 0.2 wt. % it is necessary to cast the target in vacuum or under a practically oxygen-free inert atmosphere.

According to another refinement of the method, the various components of the overlay are applied to the substrate in sequence. For this purpose, advantageously targets are used comprised of the main components of the overlay, thus e.g., targets comprised of pure Al and (i.e., "or") pure Sn, and the sputtering is carried out at various positions of the coating [(sputtering)] apparatus. It can be particularly advantageous to use the same target for the diffusion-blocking layer and the overlay, and to form the different layers one immediately after the other on the workpieces which are to be coated.

In another variant (i.e., refinement) of the inventive method, the temperature of the substrate is varied such that the matrix-forming component is applied at a higher temperature than the component which is insoluble in the matrix. In another variant, this is achieved in that the matrix-forming component of the overlay is applied at a higher substrate temperature and prior to (the application of) the insoluble or locked component, with the temperature being reduced during the coating process. Other variation possibilities for the inventive method lie in varying the voltage applied to the substrate, to suit the requirements of the given use situation. In a technique of this type, the components with the higher melting points, e.g. the matrix-forming component or the main component of the diffusion-blocking layer, may be applied at a higher voltage than the component which is insoluble or locked in the matrix (which component has a lower melting point).

The inventive overlays can be successfully employed in sliding bearings of any type. They have proven particularly advantageous in so-called three-material (or three-layer) bearings having bearing loads between 80 and 120 N/sq mm, and at bearing backing temperatures of between 150° and 200° C. Under these conditions the inventive overlays have shown zero measurable wear after 720 hr in extended load tests.

Accordingly, it is an object of the invention to provide an improved laminate material.

A further object of the invention is providing method manufacturing laminate material in which an overlay is applied by cathode sputtering and the temperature is kept under 150° centigrade during the coating produced by the sputtering.

A further object of the invention is to provide a laminate which is inexpensive to make, and is rugged in construction and economical to use.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENT

Figure 1:
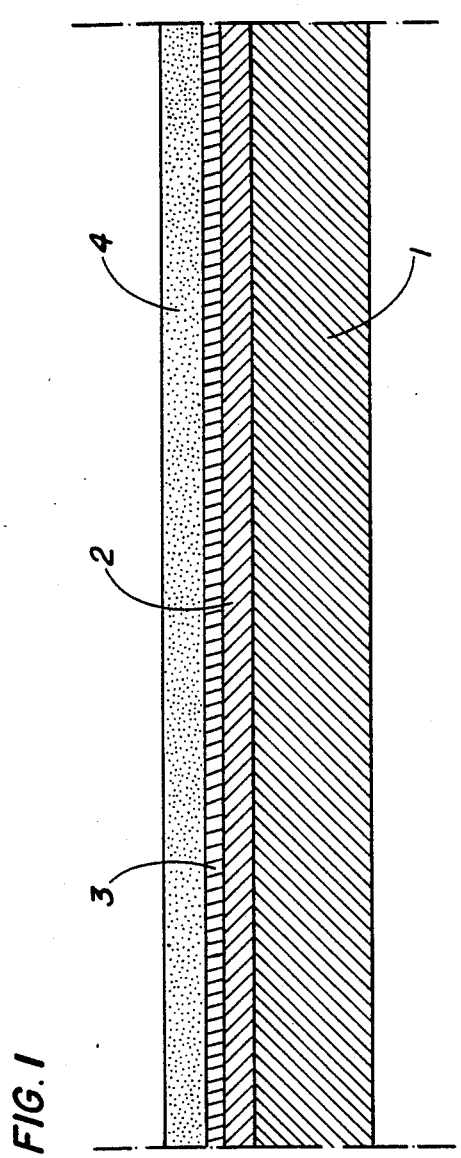
FIG. 1 is an enlarged cross section through an inventive laminate material.

Referring to the drawings in particular, the invention embodied therein comprises an approved laminate construction and method of making the laminate.

In the embodiment of FIG. 1, a support layer 2 of a material with good emergency running properties has been applied with layer thickness 200–700 $\mu$m to a steel backing (base material) 1. If a lead bronze of lead-tin bronze is used for this support layer, the layer achieves a Brinell hardness of 50–100 kp/sq mm.

Figure 2:
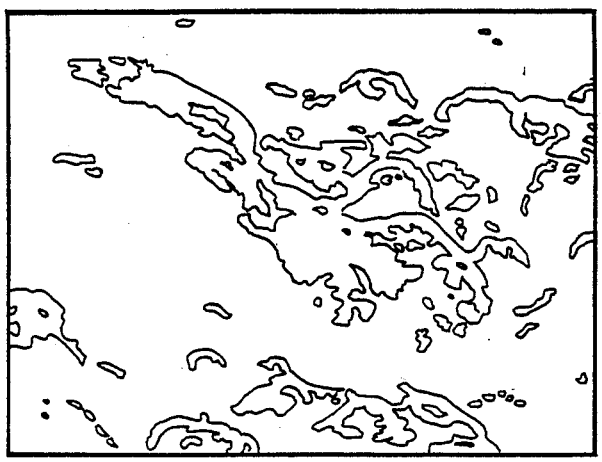
FIG. 2 is a scanning electron micrograph of the surface of an inventive overlay (b) along with [a similar micrograph] of a conventional overlay (a).
Figure 2:
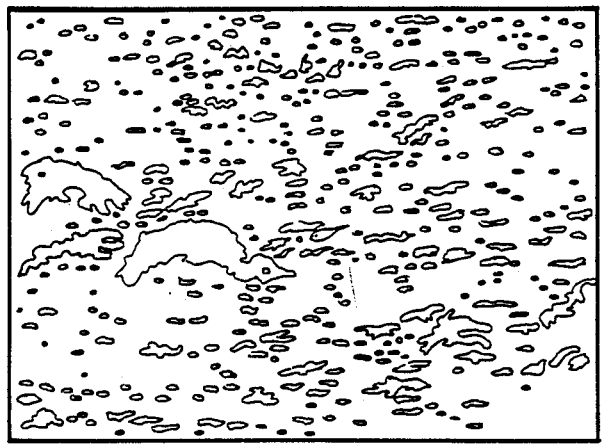

A thin diffusion-blocking layer 3 with layer thickness of the usual few microns (2–4 $\mu$m) has been applied to this support layer by sputtering. This diffusion-blocking layer 3 advantageously is comprised of one or more elements comprised in the matrix-forming material of the overlay, e.g. Ni, Cr, or an alloy of these two. The inventive overlay 4 has been applied over this blocking layer 3, by sputtering. The extremely fine particle size distribution of the insoluble or undetachable phase in comparison to the insoluble phase in ordinary overlays is seen in FIG. 2 from the scanning electron micrographs, which shows an overlay with a weight ratio 80:20:1 of the components of the overlay.

The following reaction conditions are used to produce the inventive laminate materials:

EXAMPLE 1

A cathode sputtering apparatus of a type which is per se known was used for the sputtering, wherein a ring-shaped, dense plasma is concentrated by a magnetic field immediately ahead of the cathode. The apparatus has a cylindrical processing chamber, on the external side of which up to four sources can be mounted vertically, each such source having an area of 322.6 sq cm. The substrates to be coated were also mounted vertically, on a support which can be rotated by drive means controllable at between 0.2 and 24.5 rpm, (see, e.g., Blazers product information bulletins BB 800 246 PD (August 1985) and BB 800 039 RD (July 1985)).

Bearing seats of unalloyed tool steel (e.g., [German] Material No. 1,162, Short Name C80W2) were coated for 8 hr in this sputtering apparatus at a substrate temperature of 60° C., and a pressure of 1.2 Pa (argon, with oxygen mixed in at 0.8 vol.%). To maintain this substrate temperature, 0.024 cu m cooling water per hour per bearing seat being coated was required. The targets used were:

pure (99.99%) Al, at 470 V; and
a zinc bronze (SnCu5), at 620 V.

The substrate was rotated at a constant 15 rpm. The coating thickness at the end of the treatment was c. 150 $\mu$m, corresponding to a coating rate of c. 0.3 $\mu$m/min.

The overlay produced by this technique had a weight ratio Al:Sn:Cu of 80:20:1 (corresponding to AlSn20Cu1) and an oxide content of 0.2 wt.%. The Brinell hardness of the overlay was 83, and was unchanged after heat treatment at 170° C. for 200 hr. In a test on a bearing testing machine for 250 hr under a load of 70 N/sq mm and a bearing backing temperature of 160° C., there was no wear on the overlay.

EXAMPLE 2

Bearing seats of the same tool steel [as in Example 1] (Ger. Material No. 1,1625 with a 200 $\mu$m thick support layer of CuPb23Sn4 (lead bronze) applied in a dipped process were coated at a substrate temperature of 30° C. and in complete absence of oxygen, with the other conditions being the same as in Example 1. The amount of cooling water required was 0.035 cu m per hour per bearing seat being coated. The following targets and power densities were used for applying the overlay: two targets of AlSi (with 20 kW/322 sq cm), one target of Sn (with 10.3 kW/322 sq cm), and one target of Pb (with 11 kW/322 sq cm). The result was an overlay with composition AlSi4Sn15Pb10, having Vickers hardness $(HV_{0.1})=175$.

EXAMPLE 3

Bearing seats with a support layer comprised of lead bronze as described in Example 2 were provided with a thin diffusion-blocking layer before application of the overlay. For this purpose, only the two AlSi alloy targets were employed (12 min, 30° C. [substrate temperature], 322 sq cm [target area]). The layer thickness of the diffusion-blocking layer produced in this manner was c. 2 $\mu$m. The two other targets were then activated and the coating was completed under the same conditions as in Example 2.

EXAMPLE 4

The process conditions of Example 3 were varied in that for a 12 minute period no cooling was applied to the substrate during application of the diffusion-blocking layer comprised of AlSi alloy, resulting in development of a temperature of 200° C. The two other targets were then activated and the cooling was regulated to reduce the substrate temperature to 80° C. In all other respects the coating was carried out as in Example 2.

EXAMPLE 5

The conditions of Example 1 were varied in that the temperature was continuously increased from 20° to 190° C. during the application of the overlay, by appropriate regulation of the cooling. The result was an overlay with a mean particle size of the insoluble component which increased toward the surface, with a corresponding decrease in hardness [as the surface was approached].

EXAMPLE 6

The process conditions of Examples 2 and 3 were varied in that the diffusion-blocking layer was applied by sputtering at 50° and a substrate voltage of −200 V, while the overlay was applied with the aid of the 4 different targets at a substrate voltage of −40 V. The overlay composition corresponded to that of Example 2 (AlSi4Sn15Pb10), with slightly increased hardness (Vickers hardness $HV_{0.1}=180$).

EXAMPLE 7

A diffusion-blocking layer comprising of NiCu30 [was applied] at a layer thickness of 1.5 μm, followed by an overlay of approximate composition AlSn20Cu1, under the conditions of Example 1 [but] in the complete absence of oxygen. To reduce the porosity of the overlay, a substrate temperature of 130° C. was maintained during the [sputtering], and the substrate voltage was increased continuously during [i.e., over] the 50 min duration of the treatment from −40 V to −180 V. The overlays produced thereby had higher corrosion resistance than those of Example 1.

While specific embodiments of the invention have been shown and described in detail to illustrate the application of the principles of the invention, it will be understood that the invention may be embodied otherwise without departing from such principles.

What is claimed is:

1. A laminated bearing stock, comprising, a substrate structure, at least one cathode sputtered under 150° C. sliding layer applied over said substrate structure, said sliding layer comprising a mixture of particles distributed in a particle size distribution, said mixture of particles containing: at least one metallic material forming a solidly coherent matrix, and at least one additional metallic material being substantially insoluble in said matrix material in the solid state, said material insoluble in said matrix having a lower melting point than said matrix material, and said material insoluble in said matrix being constituted of particles, said particles of said material insoluble in said matrix having diameters distributed in a normal statistical distribution with a mean value of $X=\leqq 0.8$ μm.

2. A laminate material according to claim 1; wherein the material insoluble in the matrix contains at least one of the following elements as its main component: Sn, Pb, In, Zn.

3. A laminate material according to claim 1; wherein said matrix-forming material contains an alloy having as its main component at least one of the following elements: Al, Cr, Ni, Mg, Cu.

4. A laminate material according to claim 1; wherein said layer contains an alloy with one of the following constituents: AlCuSn, AlCuPb, AlCuSnPb, AlSiSn, AlSiPb, AlSiSnPb, CuSn, CuPb, CuSnPb.

5. A laminate material according to claim 1, wherein said layer has a layer thickness between 10 and 30 μm.

6. A laminate according to claim 1, wherein the diameters of the particles of the material insoluble in the matrix are statistically normally distributed, with a mean value x between 0.05 and 0.4 μm.

7. A laminate material according to claim 1; wherein a support layer comprised of a material with good "emergency running" properties is disposed between the base material and the overlay.

8. A laminate material according to claim 7; wherein said substrate contains one of the following elements or materials: Sn, Pb, Sb, Cu, zinc bronzes, zinc-lead bronzes, babbitt metals.

9. A laminate material according to claim 5, wherein said layer has a layer thickness between 12 and 16 μm.

10. A laminate material, according to claim 7, wherein a diffusion-blocking layer is applied between said base material and the overlay in addition to the support layer.

11. A laminate material according to claim 7, wherein said diffusion-blocking layer contains an alloy having as its main component at least one of the following elements: Al, Cr, Ni, Mg and Cu.

12. A laminated bearing stock according to claim 1, wherein said sliding layer contains an alloy chosen from the group AlCuSn, AlCuPb, AlCuSnPb, AlSiSn, AlSiPb, CuSn, CuPb, and CuSnPb.

13. A laminated bearing stock according to claim 1, wherein the diameters of said particles of said material insoluble in said matrix have mean value from between 0.05 and 0.4 μm.

14. A laminated bearing stock according to claim, 1 wherein the oxygen concentration of said sliding layer is less than 0.2% by weight.

15. A laminated bearing stock according to claim 1, wherein a support layer comprises a material with significant emergency running properties which is disposed between said substrate structure and said sliding layer.

16. A laminated bearing stock according to claim 15, wherein between said substrate and said support layer there is disposed a diffusion-blocking layer containing at least one alloy having as its main components at least one of the following elements: Al, Cr, Ni, Mg, Cu.

17. A laminated bering stock according to claim 14, wherein between said support layer and said sliding layer there is disposed a diffusion-blocking layer containing at least one alloy having as its main components at least one of the following elements: Al, Cr, Ni, Mg, Cu.

18. A sliding bearing formed from the laminated bearing stock of claim 1.

19. A laminate material according to claim 1; wherein said material comprises a plurality of layer forming overlays.

* * * * *